(12) United States Patent
Massingill

(10) Patent No.: US 7,239,024 B2
(45) Date of Patent: Jul. 3, 2007

(54) SEMICONDUCTOR PACKAGE WITH RECESS FOR DIE

(76) Inventor: Thomas Joel Massingill, 170 Northridge Dr., Scotts Valley, CA (US) 95066

( * ) Notice: Subject to any disclaimer, the term of this patent is extended or adjusted under 35 U.S.C. 154(b) by 138 days.

(21) Appl. No.: 10/718,383

(22) Filed: Nov. 19, 2003

(65) Prior Publication Data

US 2004/0195699 A1    Oct. 7, 2004

Related U.S. Application Data

(60) Provisional application No. 60/460,367, filed on Apr. 4, 2003.

(51) Int. Cl.
*H01L 23/48* (2006.01)
*H01L 23/498* (2006.01)
*H01L 23/28* (2006.01)
*H01L 23/31* (2006.01)

(52) U.S. Cl. .............................. 257/778; 257/E21.503; 257/E23.004; 257/E23.021; 257/E23.024; 257/E23.069; 257/E23.125; 257/E25.013; 257/E23.172; 257/E23.065; 257/E23.177; 257/E23.179; 257/E23.064; 257/E23.07; 257/E23.19; 257/668; 257/737; 257/738; 257/699; 257/697; 257/698; 257/691; 257/783

(58) Field of Classification Search ........ 257/E21.503, 257/E23.004, E23.021, E23.024, E23.069, 257/E23.125, E25.013, E23.172, E23.065, 257/E23.177, E23.179, E23.064, E23.07, 257/734, 737

See application file for complete search history.

(56) References Cited

U.S. PATENT DOCUMENTS

| 5,140,404 | A | * | 8/1992 | Fogal et al. ................. 257/783 |
| 5,208,656 | A | * | 5/1993 | Matsuyama et al. ........ 174/253 |
| 5,363,275 | A | * | 11/1994 | Frankeny et al. ........... 361/749 |
| 5,420,460 | A | | 5/1995 | Massingill |
| 5,438,224 | A | * | 8/1995 | Papageorge et al. ........ 257/777 |
| 5,518,964 | A | * | 5/1996 | DiStefano et al. .......... 438/113 |
| 5,639,990 | A | * | 6/1997 | Nishihara et al. .......... 174/52.2 |
| 5,869,889 | A | | 2/1999 | Chia |
| 6,265,762 | B1 | * | 7/2001 | Tanaka et al. .............. 257/676 |
| 6,329,220 | B1 | * | 12/2001 | Bolken et al. .............. 438/106 |
| 6,376,769 | B1 | * | 4/2002 | Chung ........................ 174/524 |
| 6,472,732 | B1 | * | 10/2002 | Terui .......................... 257/678 |
| 6,504,245 | B1 | * | 1/2003 | Noguchi ..................... 257/737 |
| 6,512,302 | B2 | * | 1/2003 | Mess et al. ................. 257/777 |
| 6,630,734 | B2 | * | 10/2003 | Okamoto et al. ........... 257/707 |
| 6,659,512 | B1 | * | 12/2003 | Harper et al. ............... 257/777 |
| 6,707,151 | B2 | * | 3/2004 | Noguchi ..................... 257/737 |

(Continued)

FOREIGN PATENT DOCUMENTS

JP        4-133342    *   5/1992    ................. 257/697

(Continued)

*Primary Examiner*—Alexander Oscar Williams
(74) *Attorney, Agent, or Firm*—Donald R. Boys; Central Coast Patent Agency, Inc

(57) ABSTRACT

A semiconductor package is disclosed with a recess (51) for an integrated circuit die (52). The recess is made by bending or deforming all layers of a package substrate, and therefore the recess contains circuitry to connect to the integrated circuit die. The integrated circuit die is electrically connected to the package substrate by either wirebonds (53a), TAB or die solder balls (53b). The package substrate (50), a single sided printed wiring board, has a thick metal core (100) and one or more thin build up layers.

7 Claims, 3 Drawing Sheets

U.S. PATENT DOCUMENTS

| | | | |
|---|---|---|---|
| 6,762,509 B2 * | 7/2004 | Hilton et al. | 257/787 |
| 6,774,466 B1 * | 8/2004 | Kajiwara et al. | 257/673 |
| 6,835,577 B2 * | 12/2004 | Baleras et al. | 438/11 |
| 6,864,120 B2 * | 3/2005 | Murayama et al. | 438/106 |
| 6,870,257 B2 * | 3/2005 | Zhong et al. | 257/700 |
| 7,009,293 B2 * | 3/2006 | Hashimoto | 257/730 |
| 2004/0094831 A1 * | 5/2004 | Aoyagi | 257/678 |
| 2004/0118603 A1 * | 6/2004 | Chambers | 174/261 |
| 2004/0190304 A1 * | 9/2004 | Sugimoto et al. | 362/555 |
| 2004/0195699 A1 * | 10/2004 | Massingill | 257/778 |
| 2005/0046035 A1 * | 3/2005 | Egawa | 257/777 |
| 2005/0218514 A1 * | 10/2005 | Massingill | 257/737 |
| 2006/0055053 A1 * | 3/2006 | Yamazaki et al. | 257/778 |

FOREIGN PATENT DOCUMENTS

| | | | |
|---|---|---|---|
| JP | 7-283336 | * | 10/1995 |
| JP | 11-145322 | * | 5/1999 |

* cited by examiner

SEMICONDUCTOR PACKAGE WITH RECESS FOR DIE

CROSS-REFERENCE TO RELATED APPLICATIONS

This application is entitled to, and claims the benefit of Provisional Patent Application No. 60/460367, filed on Apr. 4, 2003, by the present inventor.

FEDERALLY SPONSORED RESEARCH

Not applicable

SEQUENCE LISTING OR PROGRAM

Not applicable

FIELD OF THE INVENTION

This invention relates to ball grid array packages for semiconductor devices, and more particularly to thin cavity down ball grid array packages for either wirebond, TAB, or solder ball attached semiconductor integrated circuits.

BACKGROUND OF THE INVENTION

A semiconductor package mounts an integrated circuit die, and provides electrical and thermal connections between the die and an electronic subsystem, while also providing mechanical and environmental protection to the die. A ball grid array package performs these functions by mounting the die on a substrate. The electrical pads of the die are attached to conductive traces on the substrate. Electrical connections between the die and the substrate have been made by wirebond, solder balls, or TAB. The conductive traces on the substrate fanout from the die to an array of package pads. Each package pad has a package solder ball, which makes electrical contact to a pad on an electronic subsystem circuit board. The substrate is mounted flush to the circuit board, separated by the diameter of the package solder balls. The substrate has been fabricated in various technologies; such as printed wiring board, multi-layer ceramic, or polyimide flex circuit.

A known problem with ball grid array package is mechanical fatigue of the package solder balls. There is a thermal coefficient of expansion (TCE) mismatch between the package and the circuit board. During power on/off cycles the package and board heat at different rates, and operate at different temperatures, so their expansion and contraction is not uniform. The difference in expansion causes strain across the package solder balls, resulting in reliability fails from fatigue. It is advantageous to match the TCE of the package to the TCE of the circuit board, thereby minimizing differences in expansion and the strain across the solderballs and reducing reliability failures from fatigue.

In a cavity up design the die is mounted on one side of the substrate and electrical connections to the circuit board are made on the opposite side of the substrate. The electrical connections between the die and the substrate are made by wirebond, TAB or solder balls. As the electrical connections to the die and the circuit board are on opposite sides of the substrate, it is necessary to include and provide electrical vias, through and connecting both sides of the substrate. As the pitch of the array of package pads is reduced from 1.27 mm or 1.0 mm to 0.8 mm, 0.65 mm, or 0.5 mm, the through via consumes a larger percentage of area on the substrate. This blocks the routing of the conductive traces, and requires the use of a more expensive substrate technology.

For solder ball attached die there is also a TCE mismatch, this time between the die and the substrate. Again, it is advantageous to match both TCEs, but this time TCE of the die to the TCE of the substrate, to reduce the fatigue failure of the die solder balls, and improve reliability. However, the TCE of a silicon die is 2 ppm/C and the TCE of a typical circuit board is 18 ppm/C, so it is not possible to match the TCE of the substrate to both the die and the circuit board. However it is beneficial to be able to engineer and design the TCE of the substrate to obtain optimum reliability.

Also for a solder ball attached die, the back of the die is exposed and a heatspreader may be attached to improve the thermal performance. The structure (substrate/die solder balls/die/adhesive/heatspreader) sandwiches the die between the substrate and the heatspreader. This sandwich structure is mechanically complex, and the components have different thermal TCE and often operate at different temperatures. Compared to a structure without a heatspreader, there is more stress on the die solder balls in the sandwich structure during thermal cycles and an increase in reliability failures. Again, it is beneficial to be able to engineer and design the TCE of the substrate to obtain optimum reliability.

There is a trade-off in adjusting the TCE of the substrate to match the die for improved die solder ball reliability and to match the circuit board for package solder ball reliability. Key factors when evaluating fatigue are the diameter of the solder balls (both die and package) and the attached area (size of die and package). When the pitch on the solder balls (die or package) is reduced, the diameter of the solder balls must also be reduced, and there is increased stress and more fatigue for a given TCE mismatch. Therefore as technology shrinks it becomes increasingly beneficial to have the ability to engineer and design the TCE of the substrate for optimum reliability.

In a cavity down design the same side of the package is used to mount the die and to make electrical connections to the circuit board. However, as the package is mounted flush to the circuit board, there is a need for a recess in the package to contain the integrated circuit die 10. Typically a hole is stamped, punched, or milled in the substrate 11 and then the substrate is attached to a support member 12 with an adhesive 13. The support member provides mechanical rigidity and is also a thermal heatspreader. The substrate is typically a polyimide flex circuit or a printed wiring board. The support member has a recess 14, which provides a space to contain the die. The multi-step process; fabricate substrate, excise hole, and laminate heatspreader increases package cost and design complexity. As an option, the support member is electrically connected to the substrate circuitry to improve performance. This electrical connection requires additional process steps and materials during the substrate attachment process, and therefore adds cost. In U.S. Pat. No. 5,420,460 (Massingill) the edge of the stamped hole 15a is outside the recess, and in U.S. Pat. No. 5,869,889 (Chia et al) the edge of the stamped hole 15b is inside the recess. The die is adhesively attached to the support member, and wirebonds 16 electrically connect the die to the circuitry on the substrate. The recess, die and wirebonds are coated with epoxy encapsulation 17 for environmental protection. Package solder balls 18 are attached to the array of package pads to complete the package.

The process of making the recess, removes a portion or all of the substrate in the recess area, and therefore removes the capability of having substrate circuitry in the total recess area. As the circuitry has been removed, the ability for attaching a die with solder balls is not available, and solder ball attached die are not used.

Consequently a need exists for a cavity-down ball grid array package with a recess that allows substrate circuitry, does not have through vias, includes an integral electrically connected heatspreader that does not sandwich the die, has reduced steps and materials for forming the recess, allows electrical connections to the die with wirebond, TAB, or solder balls, and allows the TCE of the substrate to be adjusted for optimum reliability.

SUMMARY OF THE INVENTION

It is an object of the invention to provide a cavity down ball grid array package in which the recess has substrate circuitry in the total recess area, and the circuitry allows multiple signal types and voltages under the die.

It is a further object of the invention to fabricate the recess with a reduce number of steps by including an integral heatspreader as part of the substrate, and to control the TCE of the heatspreader to be close to the TCE of a die (2 ppm/C), to the TCE of a circuit board (18 ppm/C), or halfway between at 10 ppm/C, as required to improve the overall reliability of an electronic subsystem utilizing the invention.

It is a further object of the invention to use a substrate technology that does not require through vias which block routing, and to electrically connect the integral heatspreader as a ground or power plane to improve the electrical performance of the package without adding an additional patterned metal layer.

It is a further object of the invention to provide electrical connections between the die and the substrate by wirebond, TAB or solder balls.

In accordance with these and other objectives of the invention, an improved cavity-down ball grid array package is disclosed. It is fabricated from a printed wiring board substrate, which includes an integral heatspreader. Further, the material for the heatspreader may be selected to determine the TCE of the package, and to design the TCE of the package for optimal system reliability. After the printer wiring board is fabricated a recess is formed for an integrated circuit die. The recess is formed without additional material, and without excising a hole in the substrate. Therefore, the recess has substrate circuitry, in the total recess area, for electrical connections to the die, which are made by wirebonds, TAB, or solder balls.

A printed wiring board is fabricated, which has a thick metal core and one or more thin build-up layers and a solder mask passivation layer. Each buildup layer has an organic dielectric layer with vias and a patterned metal layer. The circuitry on the printed wiring board includes package bond pads for electrical connection to the integrated circuit die and package pads for electrical connections to an electronic circuit board. Conductive traces fanout from the package bond pads to an array of the package pads. A recess is formed in the printed wiring board by bending or deforming the metal core with a mandrel in a press. An integrated circuit die is attached in the recess, and is electrically connected to the printed wiring board. For wirebond connections, adhesive is used to connect the back of the die to the recess and wirebonds attach to die bond pads on the front surface of the die and to the package bond pads on the printed wiring board; epoxy is used to encapsulate and provide environmental protection to the recess, die and wirebonds. For solder ball connections, die bond pads on the front of the integrated circuit die are attached to the package bond pads on the printed wiring board with solder balls; epoxy is applied between and around the solder balls completely filling the gap between the die and the printed wiring board. The package pads are prepared with package solder balls to make a ball grid array (BGA), package pins to make a pin grid array (PGA), or left as is for a land grid array (LGA). The package is mounted and makes electrical contact to pads on an electronic subsystem circuit board, by the package solder balls, package pins or package pads.

Additional objectives, features and advantages of the various aspects of the present invention will become apparent from the following description of its Preferred Embodiments, which description should be taken in conjunction with the accompanying drawings.

DRAWING—REFERENCE NUMERALS

| | Prior Art | | |
|---|---|---|---|
| 10 | integrated circuit die | 15a, 15b | edge of excised hole |
| 11 | substrate | | |
| 12 | support member | 16 | wirebonds |
| 13 | adhesive | 17 | epoxy encapsulation |
| 14 | recess | 18 | package solder balls |
| | Present Invention | | |
| 50 | printed wiring board | 54a | epoxy encapsulation |
| 51 | recess | 54b | organic underfill |
| 52 | integrated circuit die | 55 | package solder ball |
| 53a | wirebond | 56 | die bond pad |
| 53b | die solder ball | 57 | package bond pad |
| | | 58 | package pin |
| 100 | metal core | 102a | epoxy dielectric (2nd build-up layer) |
| 100a | passivation layer | | |
| 100b | adhesion layer | 102b | via (2nd build-up layer) |
| 101a | epoxy dielectric (1st build-up layer) | 102c | metal layer (2nd build-up layer) |
| 101b | via (1st build-up layer) | 105 | solder mask |
| 101c | metal layer (1st build-up layer) | 106 | coating |
| | | 107 | thermal via |

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover any alternatives, modifications and equivalents, which may be included within the spirit and scope of the invention as defined by the appended claims.

Figure 1:
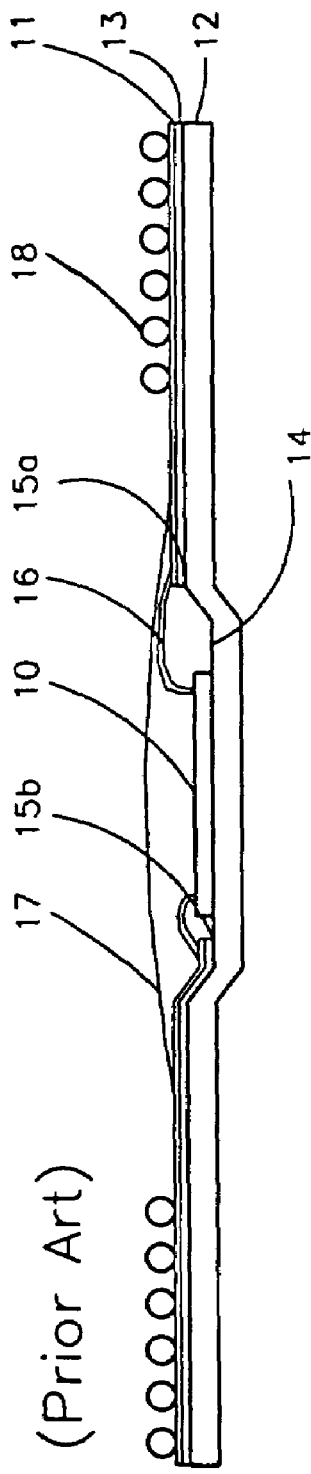
FIG. 1 is a cross-sectional view of a conventional cavity-down ball grid array.
Figure 2:
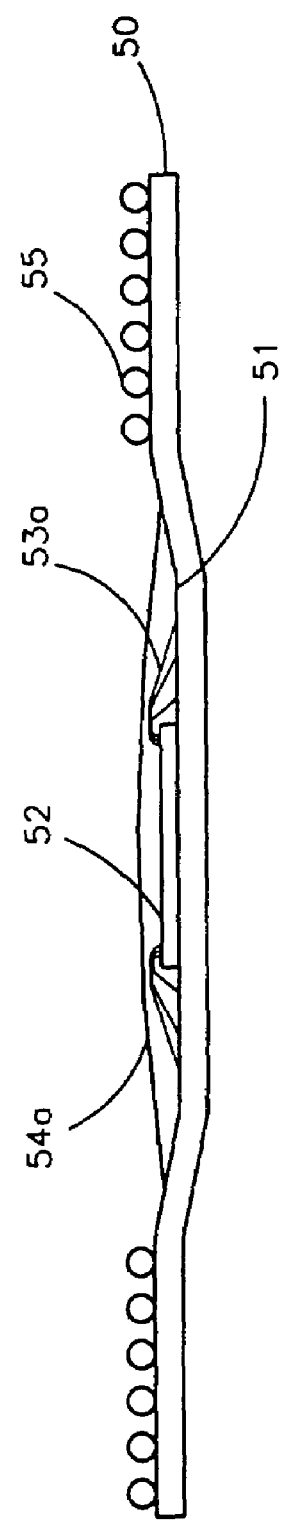
FIG. 2 is a cross-sectional view of a first embodiment of the present invention with a wirebond die.
Figure 3:
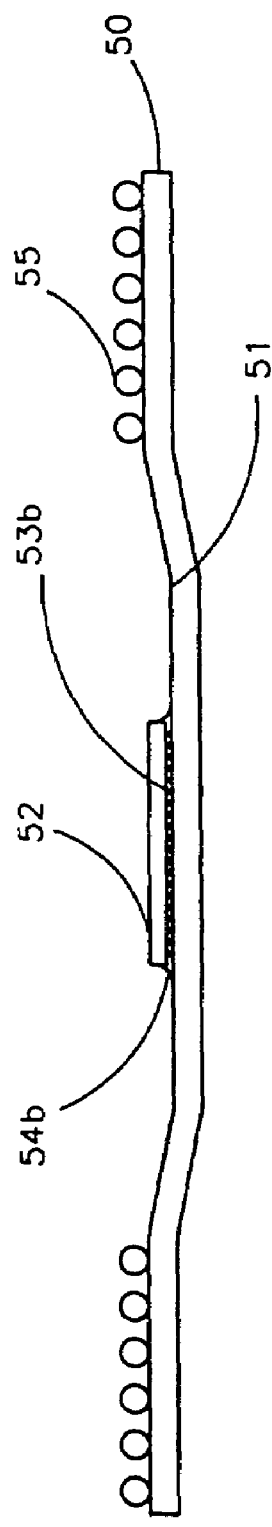
FIG. 3 is a cross-sectional view of a second embodiment of the present invention with a solder ball attached die.

FIGS. 2 and 3 are cross-sectional views of a cavity-down ball grid array, and are the preferred embodiments of the present invention. In FIG. 2, the electrical connections between die bond pads 56 on an integrated circuit 52 and package bond pads 57 on a single sided printed wiring board 50 are made by wirebonds 53a. An epoxy encapsulation 54a is coated over the die and wirebonds for environmental protection. In FIG. 3, the electrical connections between the die pads on the integrated circuit and the bond pads on the single sided printed wiring board are made by die solder balls 53b. The gap between the die and the printed wiring board is filled with an organic underfill 54b to reduce stress on the die solderballs and to add environmental protection.

Figure 4:
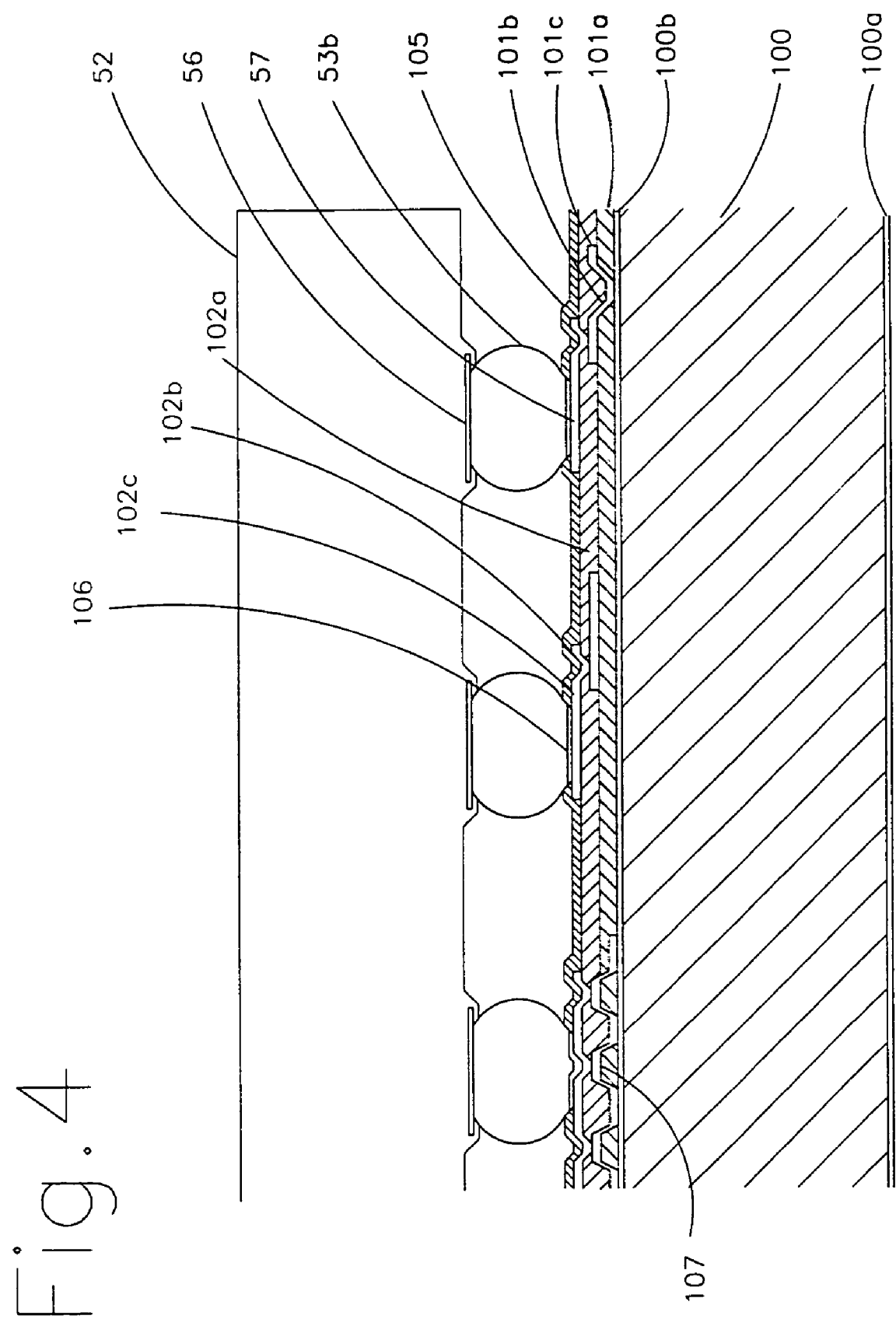
FIG. 4 is a cross-sectional view of the single sided printed wiring board of the present invention.
Figure 5:
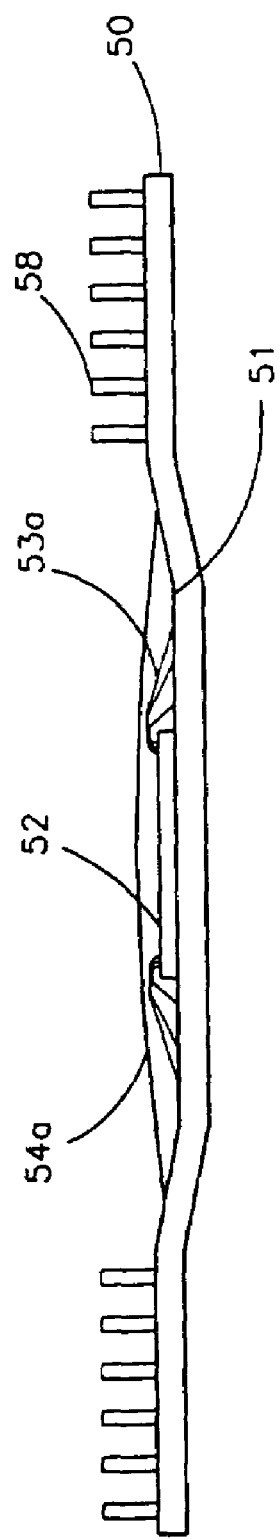
FIG. 5 is an alternate embodiment where the package solder balls are replaced with pins.

FIG. 4 is a cross-sectional view of the single-sided printed wiring board 50. The board has a metal core 100 of copper or copper alloy, with a thickness of between 0.25 mm and 1.00 mm. On the side that will not have build-up layers, there is an optional passivation layer 100a, such as an electro-plated nickel layer, or a black copper oxide layer. On the side that will have build-up layers, there is an optional adhesion layer 100b, such as a red or black copper oxide layer. On the adhesion layer is a first build-up layer comprising an epoxy dielectric 101a, vias 101b, and a patterned metal layer 101c. On the first build-up layer is a second build up layer comprising an epoxy dielectric 102a, vias 102b, and a patterned metal layer 102c. On the second build up layer is an organic solder mask layer 105, with pad openings exposing the metal layer of the second build-up layer. The metal in the pad opening has a coating 106 to contact the electrical connection to the die. When the die is connected with wirebonds the coating is electroless plated nickel, with a thickness of 100 to 200 uinch, and electroless plated gold, with a thickness of 30-100 uinch. When the die is connected with solder balls, the coating is electroless plated nickel, with a thickness of 100 to 200 uinch, and immersion gold, with a thickness of 1-10 uinch.

There are multiple commercially available processes for producing the build-up layers, with variations in dielectric material, via formation and metal deposition and patterning. The preferred method is using an un-supported epoxy films for the dielectric, UV lasers to form the micro-vias, and metal deposition and patterning by electroless copper seed deposition, and pattern electro-plated copper for trace deposition. Other commercially available process are (1) liquid photo imageable epoxy, with photo developed vias, electroless copper seed deposition, and pattern electro-plated copper trace deposition or (2) resin coated copper dielectrics, laser micro vias and pattern electro-plated copper trace deposition. The solder mask material is a liquid photoimageable epoxy.

The circuit design of the printed wiring board includes package bond pads, package pads, conductive traces, conductive planes, and thermal vias. The package bond pads make electrical connection to the die with wire bond, TAB, or solder balls. The package pads make electrical connection to a circuit board in an electronic subsystem, with package solder balls 55 to make a ball grid array, package pins 58 to make a pin grid array, or left as is for a land grid array. The package bond pads and package pads are connected to other package pads, other package bond pads or the metal core with conductive traces, conductive planes, and vias. Under the die there may be thermal vias 107 to the metal core, these are thermal metal pads and vias that provide a metallic thermal conduction path from the die to the metal core. These thermal vias and conduction paths need not, but may also connect to electrical circuits of the design. With or without thermal vias the metal core is an integral heatspreader for the die. Heat from the die is conducted into the metal core, and radiated out from the back of the metal core and also conducted from the metal core into the package solder balls and into the subsystem circuit board.

For a solder ball attached die the thermal heat flow is from the active surface of the integrated circuit, through the solder balls and underfill, through thermal vias and into the metal core. In comparison, the thermal heat flow in a conventional BGA, with a solder ball attached die on an organic substrates, is from the active surface, through the silicon substrate, through a heatspreader adhesive and into the heatspreader. A separate heatspreader, heatspreader adhesive and attachment process are eliminated with the invention.

A recess 51 in the printed wiring is formed in a hydraulic press, the press containing a mandrel of the desired recess shape. The depth of the recess is the thickness of the mounted integrated circuit plus the thickness of the electrical connections and encapsulation minus the diameter of the package solder balls plus a desired clearance. The clearance being a minimum gap under the package required for cleaning. For a 12 mil thick die+1 mil thick die adhesive+8 mil wirebond loop and encapsulation−20 mil package solder ball+10 mil clearance, the minimum depth of the pressed recess is 11 mils. The width and length or the recess must contain the die and electrical connections as a minimum, and may extend to within a minimum space to the first inner row of solder balls. For a 35 mm BGA, with 352 package balls in a 26×26 array of 1.27 mm pitch and 18 internal rows depopulated, the recess may be as large as 21 mm.

The printed wiring board described has an unbalanced TCE. The TCE of the epoxy layers is higher than the metal core, and only on a single side. Unbalanced TCE structures can warp and bow, so a TCE matching layer may be included on the opposite side of the metal core to make a balanced TCE structure. This matching layer may be attached during fabrication of the printed wiring board by lamination of dielectric layers to the back of the metal core or after die assembly with a screened or dispensed liquid epoxy.

Standard semiconductor die assembly process is used to mount, make electrical connection to, and passivate the die, and to prepare the package pads. For wirebond connections, adhesive is used to connect the back of the die to the recess and wirebonds attach to the die bond pads on the front surface of the die and to the package bond pads on the printed wiring board; epoxy is used to encapsulate and provide environmental protection to the recess, die and wirebonds. For solder ball connections, die bond pads on the front of the die are attached to the package bond pads on the printed wiring board with solder balls; epoxy is applied between and around the solder balls completely filling the gap between the die and the printed wiring board. The package pads are prepared with solder balls to make a ball grid array, pins to make a pin grid array, or left as is for a land grid array.

Although several preferred embodiments have been described in detail herein with reference to accompanying drawings, it is to be understood that the invention is not limited to these precise embodiments, and that various changes and modifications may be effected therein by one skilled in the art without departing from the scope or spirit of the invention as defined in the appended claims.

What is claimed:

1. A semiconductor package assembly, comprising:
   a die having electrical contact pads for external connection and a height;
   a predominantly metal substrate having a recessed area with a depth at least equal to the height of the die; and solder balls between the electrical contact pads of the die and patterned circuitry on the substrate in the recessed area thereby mounting the die to the substrate and connecting to the substrate circuitry;

wherein the substrate comprises a dielectric layer on the recessed side insulating the patterned circuitry extending into the recessed area, the die is mounted in the recessed area with electrical connections provided between the electrical contact pads of the die and the patterned circuitry in the recessed area, vias are formed through the dielectric layer separating the metal substrate from the patterned circuitry, and a plurality of solder ball connections are made to the metal of the substrate from individual ones of the contact pads of the die, providing direct, conductive heat transfer between the die and the metal of the substrate.

2. The semiconductor package assembly of claim 1 further comprising solder balls mounted to individual traces of the substrate patterned circuitry in area outside the recessed area providing facility to connect the traces to circuitry on a printed circuit board.

3. The semiconductor package assembly of claim 1 wherein the metal of the predominantly metal substrate is predominantly copper or stainless steel.

4. The semiconductor package assembly of claim 1 wherein the die is mounted to the substrate in the recessed area by adhesive with the electrical contact pads facing away from the substrate, and the electrical connections are provided between the electrical contact pads of the die and the patterned circuitry in the recessed area by wire bonds.

5. The semiconductor package assembly of claim 4 further comprising plastic material encapsulating the die and the wire bonds, and either package pins or solder balls connected to individual traces of the substrate patterned circuitry in substrate area outside the recessed area.

6. A substrate for a semiconductor package, comprising:
a metal plate having a central recessed area;
a dielectric layer formed on the metal plate on the recessed side;
patterned, electrically-conductive circuitry formed on the dielectric layer, electrically insulated from the metal plate, the circuitry extending into the recessed area and vias formed through the dielectric layer, providing direct, heat-conducting paths from the circuitry side of the substrate to the metal plate.

7. The substrate of claim 6 further comprising either contact pins or solder balls mounted to the patterned, electrically-conductive circuitry in the area outside the recessed area.

* * * * *